US012670307B1

(12) United States Patent
Telharkar et al.

(10) Patent No.: US 12,670,307 B1
(45) Date of Patent: Jun. 30, 2026

(54) PROGRAMMABLE SEQUENCE-DRIVEN HARDWARE TRIGGER FOR MULTIPLE FPGA SYSTEM

(71) Applicant: Cadence Design Systems, Inc., San Jose, CA (US)

(72) Inventors: Shantanu Telharkar, San Jose, CA (US); Sheng-Shiung Wu, Pleasanton, CA (US); Raju Joshi, Los Altos, CA (US); Vasant Ramabadran, San Jose, CA (US); Suresh Gopalrathnam, Los Altos, CA (US); Anand Gupta, Ghaziabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 973 days.

(21) Appl. No.: 17/901,570

(22) Filed: Sep. 1, 2022

(51) Int. Cl.
*G06F 30/347* (2020.01)

(52) U.S. Cl.
CPC .................................. *G06F 30/347* (2020.01)

(58) Field of Classification Search
CPC ........................................... G06F 30/347
USPC ........................................... 716/117
See application file for complete search history.

(56) References Cited

U.S. PATENT DOCUMENTS

| | | | | |
|---|---|---|---|---|
| 10,846,449 | B1 * | 11/2020 | Suresh | .................. G06F 30/343 |
| 10,970,442 | B1 * | 4/2021 | Kuyel | .................... G06F 30/33 |

| | | | | |
|---|---|---|---|---|
| 11,093,674 | B2 * | 8/2021 | Asaad | ................... G06F 30/331 |
| 11,290,534 | B2 * | 3/2022 | Hebert | .................. G06F 9/5038 |
| 11,946,969 | B2 * | 4/2024 | Fleckenstein | .... G01R 31/31924 |
| 2004/0254779 | A1 * | 12/2004 | Wang | .................... G06F 11/261 703/27 |
| 2006/0015313 | A1 * | 1/2006 | Wang | .................... G06F 30/331 703/14 |
| 2007/0226541 | A1 * | 9/2007 | Brunot | .................... G06F 30/33 714/28 |
| 2017/0103156 | A1 * | 4/2017 | Gupta | .................. G06F 30/398 |
| 2017/0109466 | A1 * | 4/2017 | Guerin | .................. G06F 30/331 |
| 2017/0364621 | A1 * | 12/2017 | Lepercq | ............... G06F 30/367 |
| 2019/0147130 | A1 * | 5/2019 | Asaad | ................... G06F 30/331 703/14 |
| 2021/0240897 | A1 * | 8/2021 | Elmufdi | ............... G06F 30/331 |
| 2022/0180035 | A1 * | 6/2022 | Desplechain | ....... G06F 30/3323 |
| 2023/0025207 | A1 * | 1/2023 | Fleckenstein | .... G01R 31/31727 |

* cited by examiner

*Primary Examiner* — Suchin Parihar
(74) *Attorney, Agent, or Firm* — Foley & Lardner LLP

(57) ABSTRACT

Disclosed herein are systems and methods of a prototyping system for circuit design testing. The prototyping system employs hardware ("Debug FPGA") that performs a series of Boolean evaluations according to testbench configurations loaded at runtime. FPGAs performing the DUT operate synchronously, in which each component must start, stop, and step through the DUT's operations according to the Boolean operations of the Debug FPGA. The hardware and software functions disclosed simultaneously stop the clocks of the FPGAs according to user-defined trigger conditions in the DUT output, allowing the designer to stop the prototyping system to analyze or debug the DUT. Based on the data outputs from the FPGAs performing the DUT, the Boolean expressions of the Debug FPGA detect state transitions or trigger events occurring within the DUT. When the Debug FPGA detects a trigger event, the Debug FPGA transmits a clock-stopping signal to each of the FPGAs.

20 Claims, 4 Drawing Sheets

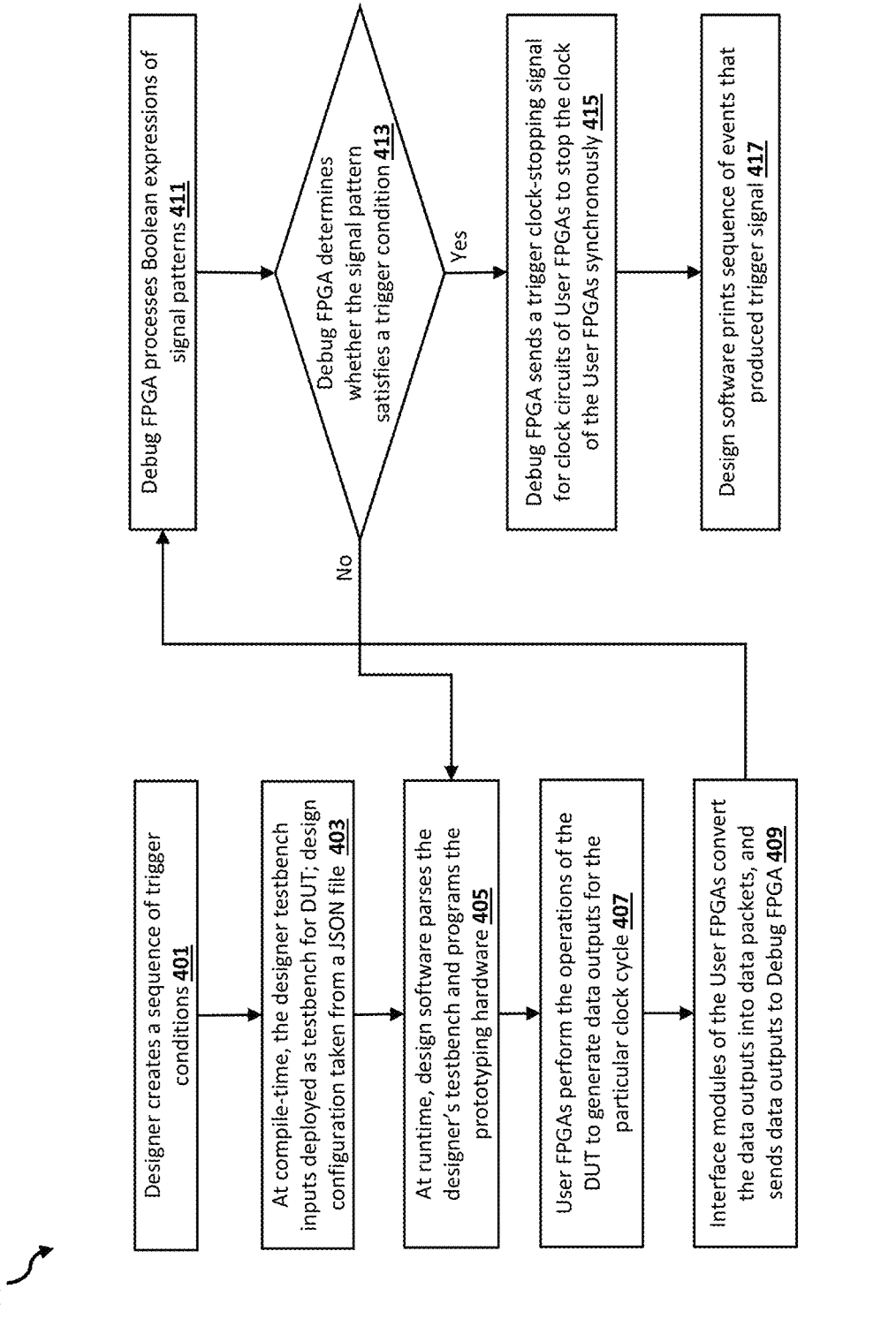

400

Designer creates a sequence of trigger conditions 401

At compile-time, the designer testbench inputs deployed as testbench for DUT; design configuration taken from a JSON file 403

At runtime, design software parses the designer's testbench and programs the prototyping hardware 405

User FPGAs perform the operations of the DUT to generate data outputs for the particular clock cycle 407

Interface modules of the User FPGAs convert the data outputs into data packets, and sends data outputs to Debug FPGA 409

Debug FPGA processes Boolean expressions of signal patterns 411

Debug FPGA determines whether the signal pattern satisfies a trigger condition 413

No

Yes

Debug FPGA sends a trigger clock-stopping signal for clock circuits of User FPGAs to stop the clock of the User FPGAs synchronously 415

Design software prints sequence of events that produced trigger signal 417

*FIG. 4*

PROGRAMMABLE SEQUENCE-DRIVEN HARDWARE TRIGGER FOR MULTIPLE FPGA SYSTEM

TECHNICAL FIELD

This application generally relates to systems and methods for prototyping integrated circuit (IC) designs using field programmable gate arrays (FPGAs) to perform functions of a design-under-test (DUT) according to testbench configurations. In particular, embodiments generally relate to components that efficiently and rapidly detect instances for stopping clock cycles of FPGAs.

BACKGROUND

A modern integrated circuit (IC) is incredibly complex, potentially containing millions of hardware circuit devices or types of logic, including FPGAs, application-specific integrated circuits (ASICs), logic gates, registers, or transistors, in addition to millions of interconnections between the circuit devices. The complexity of the ICs, combined with the volume of critical industrial products employing complex ICs, has made IC design verification an essential process in a semiconductor development cycle. Manufacturing ICs or other logic system is expensive and time-consuming, rendering testing and verification efforts for new logic system designs cost-prohibitive or cost inefficient. Processes for verifying an IC design are essential, as fabricating the IC is expensive and takes time. If the IC contains functional errors, then designers must correct and re-fabricate the IC. Accordingly, IC designers developed various different platforms and techniques functional verification of IC designs.

Circuit designers often use computer-based electronic design automation ("EDA") or similar tools for designing, synthesizing, debugging, and performing functional verification of IC circuit designs. For verification processes, IC design products include specialized systems that compile the IC design files into an executable format (often referred to as a "design-under-test" or "DUT") and perform the operations of the DUT to test the IC design. The design verification system loads and executes the DUT, then analyzes the performance of the DUT, according to the approach to design verification employed and the type of design verification system used.

One approach to testing IC designs includes emulation, performed by a type of design verification system called "emulators," which are hardware-based design verification system that implement the IC designs on re-programmable emulation processors (e.g., ASICs). Another approach to testing IC designs includes simulation, performed by type of design verification system called "simulators," which are software-based verification systems that implement the IC designs as virtual programming. Yet another approach to IC design testing includes prototyping, performed by FPGA-based prototyping systems, which employ some aspects of hardware-based and software-based verification systems and are often complementary, but prototyping systems are different from prior emulators and simulators. Generally, the emulators and simulators focus on IC design and design verification, which tests whether the IC design functionally satisfies the specified functional requirements. Prototyping usually focuses on IC design validation, which tests whether the IC design functionally meets designer or user expectations.

Generally, FPGA-based prototyping implements or synthesizes an IC design's register transfer level (RTL) functions, and tests the DUT through a series of FPGAs. Designers perform prototyping before tape-out (final result of design process before manufacturing) as part of the pre-silicon validation, and potentially employed after tape-out for software development. The prototyping system compiles the IC design into instructions sets of the DUT and loads the compiled instructions set of the DUT into the FPGAs. The prototyping system also includes design software (sometimes referred to as "testbench software") allowing the designer to generate testbench code, which includes a series of test vectors (e.g., configurations, stimuli) that are used configure behaviors of the DUT or provide external stimuli. The testbench software may include modules that receive the outputs from the DUT after the test vectors are run in the FPGAs. The FPGAs and other components of the prototyping system performing the DUT operate synchronously, in which each component must start, stop, and step through the DUT's operations according to the same synchronized clock. As such, the components of the system must perform DUT operations and exchange data signals fast enough to maintain synchronization, even if performing additional functions associated with the testbench. Likewise, if the testbench includes breakpoints to stop the DUT, the prototyping system needs to stop the clocks of the FPGAs and halt each FPGA performing the DUT.

SUMMARY

Disclosed herein are systems and methods capable of addressing the above-described shortcomings and may also provide any number of additional or alternative benefits and advantages. Embodiments include programmable hardware (sometimes referred to as a "Debug FPGA") that a designer-user programs to halt the FPGAs performing the DUT. The Debug FPGA takes data signals outputted from the FPGAs of a circuit board and then evaluates Boolean expressions within a fraction of every design clock cycle using the data from those FPGAs. The designer configures the Boolean expressions of the Debug FPGA to test for the certain trigger condition and produce a trigger signal that stops the design's execution on each of the FPGAs executing the DUT. When a DUT runs on a protoypting system, the designer's testbench evaluates the multiple Boolean expressions, comparing the outputs of the FPGAs performing the DUT against various values indicated by a designer's testbench. The designer's Boolean expressions allow the designer to program the testbench to indicate when the DUT arrives at a particular state or condition. The designer creates Boolean expressions defining the desired sequence or state, and the prototyping system includes registers that allow the system to compare aspects of the DUT (e.g., buses or signals of the DUT RTL) against constant testbench values, which persist for a given clock-step of the DUT.

The prototyping system employs a testbench that indicates, for example, bus comparators and scalar signal comparators, which the system instruments or loads into particular hardware for analysis or debugging (e.g., "Debug FPGA") at compile-time. The FPGAs (and other components of the prototyping system performing the DUT) operate synchronously, in which each component must start, stop, and step through the DUT's operations according to the Boolean operations of the Debug FPGA. The hardware and software functions disclosed herein allow the designer and the prototyping system to analyze or debug the DUT according to the testbench comparators by simultaneously or contemporaneously starting and stopping the clocks of the FPGAs. Using the data outputs from the FPGAs performing the DUT, the Debug FPGA executes the particular Boolean expressions to detect the state transitions or trigger events occurring within the DUT. When the Debug FPGA detects a trigger event, the Debug FPGA transmits a clock-stopping signal to each of the FPGAs executing the DUT, thereby stopping the clocks of the FPGAs at the same time.

Often, a rack of the prototyping system could host multiple designers simultaneously. As such, the prototyping system comprises sufficient programmable hardware (e.g., circuit boards, MUXs, FPGAs, Debug FPGAs) allocated to perform multiple designers' DUTs. Embodiments of the Debug FPGA include programmable components that ensure that the Debug FPGA sends the trigger signal to only those FPGAs allocated to the current user's DUT.

Furthermore, the verification system must minimize the amount of time needed to, for example, send a signal, evaluate the data of the signal, and return a responsive signal. Generally, the approach for minimizing these time-intervals include, for example, minimizing distances between hardware components or reducing the amount of operations performed by the hardware, among others. Employing the Debug FPGA to evaluate the Boolean expressions that are not otherwise included in the original IC design could affect the timing. At compile-time, embodiments of the testbench software may generate hardware-based or software-based executable instructions to function as interface modules of the FPGAs, and inject the interface modules into the DUT. The interface modules may generate data packets from the output data from the FPGAs performing the DUTs to transmit to the Debug FPGAs, which improves upon typical traces or wires ordinarily used to communicate signals between the FPGAs. In this way, the interface modules reduce the delay caused by transferring data to and from the Debug FPGA.

In an embodiment, a system for prototyping designs-under-test (DUTs) of integrated circuit (IC) designs using programmable field-programmable gate arrays (FPGAs). The system comprises a debug FPGA configured to: receive a signal pattern of data received from one or more user FPGAs performing a DUT; identify a state transition of the DUT based upon the signal pattern from the one or more user FPGAs performing the DUT; identify a trigger event based upon comparing the signal pattern against a trigger condition stored into a trigger mask register of the debug FPGA; and transmit a trigger signal to the one or more user FPGAs for stopping a clock of the one or more user FPGAs in response to identifying the trigger event.

In another embodiment, a system for prototyping designs-under-test (DUTs) of integrated circuit (IC) designs using programmable field-programmable gate arrays (FPGAs). The system comprises a plurality of user FPGAs, including a set of one or more user FPGAs configured to: receive an instruction set for performing a DUT for an IC design file; generate a data output based upon the instruction set for a clock cycle of a clock associated with set of one or more user FPGAs. The system further comprises a debug FPGA configured to: identify a trigger event based upon comparing a signal pattern for each data output from the set of one or more User FGPAs against a trigger condition stored into a trigger mask register of the debug FPGA; identify a master FPGA of the set of one or more user FPGAs based upon a destination indicator of a master mask register; and transmit a trigger signal to the master FPGA of the set of one or more user FPGAs for stopping the clock at the Master FPGA for the set of one or more user FPGAs.

In yet another embodiment, a system for prototyping designs-under-test (DUTs) of integrated circuit (IC) designs using programmable field-programmable gate arrays (FP-GAs). The system comprises a processor configured to: compile a plurality of instruction sets for a DUT from an IC design file and a plurality of testbench instructions according to one or more configuration files; and for a first clock cycle of the DUT, parse the plurality of testbench instructions for a plurality of registers of a debug FPGA. The system further comprises the debug FPGA configured to, for the first clock cycle of the DUT: update the plurality of registers according to the plurality of testbench instructions parsed for the first clock cycle, including a trigger mask register; identify a trigger event based upon comparing a signal pattern for data outputs from one or more user FPGAs against a trigger condition indicated by the trigger mask register; and transmit a trigger signal to the one or more user FPGAs for stopping a clock of the one or more user FPGAs in response to identifying the trigger event.

It is to be understood that both the foregoing general description and the following detailed description are exemplary and explanatory and are intended to provide further explanation of the invention as claimed.

BRIEF DESCRIPTION OF THE DRAWINGS

The present disclosure can be better understood by referring to the following figures. The components in the figures are not necessarily to scale, emphasis instead being placed upon illustrating the principles of the disclosure. In the figures, reference numerals designate corresponding parts throughout the different views.

FIG. 4 shows operations of a method for handling trigger conditions during operations for FPGA-based prototyping a DUT for an IC design, according to an embodiment.

DETAILED DESCRIPTION

Figure 1:
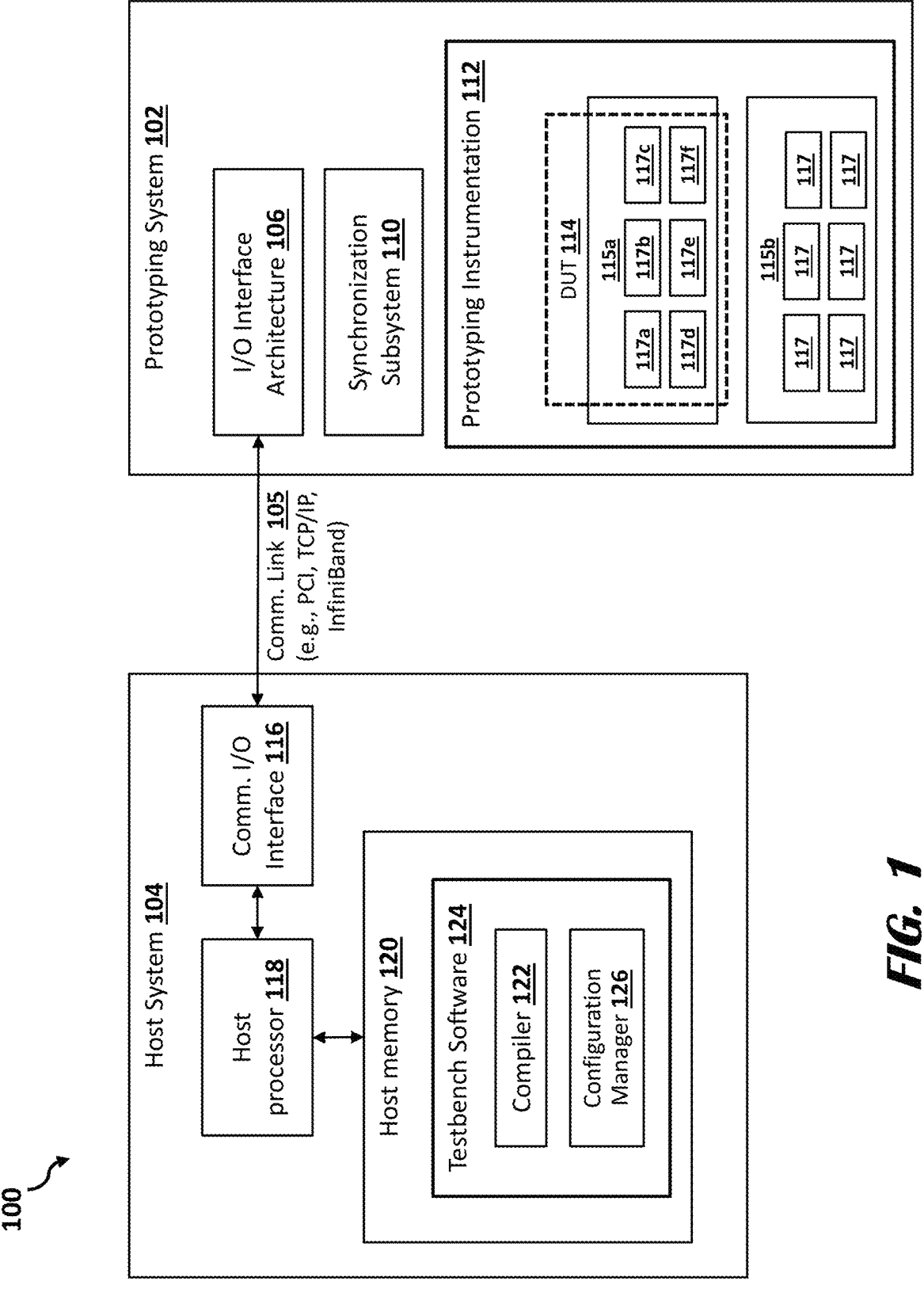
FIG. 1 shows components of a system for prototyping an IC design, according to an embodiment.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to a person skilled in the relevant art and having possession of this disclosure, are to be considered within the scope of the invention.

FIG. 1 shows components of a system 100 for prototyping a DUT of an IC design. FIG. 1 is a block diagram showing components of a host system 104 and a prototyping system 102, which are in communication with each other via the communication link 105. The communication link 105 comprises any number of computing hardware and software components establishing a bus or link between computing devices using any number of communication protocols. In operation, the communication link 105 conducts data and/or instruction transfers between the host system 104 and the prototyping system 102. Non-limiting examples of the communication link 105 includes Peripheral Component Interconnect (PCI), which may include PCI express (PCIe), TCP/IP, and InfiniBand, among other types of communication links 105.

Host System

The host system 104 may be any computing device comprising a host processor 118, a host memory 120, and one or more communication I/O interfaces 116. The host system 104 may further include any number of support circuits, such as cache memory, power supply, clock circuits, data registers, and the like. The host processor 118 of the host system 104 may include circuitry configured to execute the various processes and tasks described herein. Non-limiting examples of the host processor 118 of the host system 104 may include an x86 central processing unit (CPU), an ARM processor, a Reduced Instruction Set Computing (RISC) processor, an ASIC processor, or a Complex Instruction Set Computing (CISC) processor, among others.

The host memory 120 of the host system 104 may store various forms of software programs and files for execution by the host processor 118, such as an operating system (OS) and various types of software programming for designing the IC and managing operations of the prototyping system 102 (collectively referred to as "testbench software 124" or "design software"). The testbench or design software generally refers to a software application and library in which the user generates the IC design and testbench configuration instructions for testing or prototyping the IC design. The testbench software compiles the user's testbench configuration instructions, and then distributes or otherwise fills the correct compiled data values into the appropriate registers (or other types of memories) of the devices in the prototyping instrumentation 112. For instance, the testbench software 124 includes a compiler 122 and a configuration manager 126. The host memory 120 implementations may include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory.

In some embodiments, the communication I/O interface 116 couples the host memory 120 or the host processor 118 to the prototyping system 102. The communication I/O interface 116 manages and/or interprets communications with the prototyping system 102 over the communication link 105. The communication I/O interface 116 or other support circuit may also receive inputs from user interface devices (e.g., keyboard, mouse) for the OS of the host system 104, informing the OS of the host system 104 to, for example, generate an interactive graphical user interface (not shown) for display on a monitor or screen (not shown) coupled to the host system 104. The graphical user interfaces include, for example, interactive displays configured to receive user inputs from the various user interface devices, allowing the user to, for example, edit the IC, configure trigger conditions for debugging aspects of the IC design, and configure operations of the prototyping system 102.

The compiler 122 includes software routines of the testbench software 124 for compiling the IC design, executed by any number or various types of computing devices, such as the host system 104, prototyping system 102, or other types of computing device. Alternatively, in some embodiments, the compiler 122 is a standalone software application executed by the host device 104 configured to compile the IC design file, such as a netlist file. The compiler 122 compiles the IC design from a representational format or language that is useful for creating circuit design, into machine-executable instruction sets of the DUT 114 that can be executed by the prototyping instrumentation 112 (e.g., FPGAs) or other devices of the prototyping system 102. For instance, the testbench software 124 generates an IC design according to the designer's inputs for creating the IC design, where the testbench software 124 outputs, for example, a hardware design netlist file (e.g., hardware described in a hardware description language (HDL)) representing the IC design. The compiler 122 compiles the netlist into the instructions. In addition, the compiler 122 may receive testbench configuration inputs and compiles testbench code or configuration files into a sequence of processor-executable instructions for testing aspects the DUT 114 or testing for breakpoints in performing the DUT 114.

In operation, the compiler 122 receives and compiles the IC design file containing the IC design elements (e.g., logic gates) into logic (e.g., hardware logic or virtual logic), compiled from the IC design into the DUT 114 executed by the prototyping instrumentation 112. The compiler 122 generates a virtual logic file (representing the IC's logic elements) containing the DUT 114 for the compiled IC design. Software programs or routines of the testbench software 124 (e.g., compiler 122, scheduler software, configuration manager 126) parses and maps (or otherwise associates) the instruction sets of the DUT 114 (compiled IC design's logic and clocking operations) into the hardware components of the prototyping instrumentation 112, such as boards 115 and FPGAs 117, according to the design of the IC. The compiler 122 generates the machine-readable instructions for the components of the prototyping system 102 that cause the mapped components (e.g., circuit boards 115, FPGAs 117, MUXs) of the prototyping system 102 to perform the functions of the DUT 114.

In some cases, the compiler 122 or other aspect of the testbench software 124 generates and injects additional processor-executed instructions that manage or control various aspects of the prototyping system 102. For example, in addition to the compiled design logic, the testbench software 124 generates and injects executable code for interface modules for certain FPGAs 117, which transmit and receive data packets containing signal patterns or signal outputs generated by a sending-side FPGA 117.

The compiler 122 (or other aspect of the testbench software 124) includes a partitioner software routine and scheduler software routine. The compiler 122 receives and compiles the IC design file (e.g., netlist file, SDL file, JSON configuration file). Here, the compiler 122 parses the logic gates of the instruction sets into a database format. The compiler 122, partitioner, or other aspect of the testbench software 124 determines available components of the prototyping instrumentation 112 and allocates various portions of the compiled IC design logic to available components for performing the DUT 114. For instance, the partitioner allocates a set of FPGAs 117 (denoted "allocated FPGAs 117a-117f") of an allocated circuit board 115a to perform the user's DUT 114 according to the user's inputs. The allocated FPGAs 117a-117f include a Debug FPGA 117a and User FPGAs 117b-117f. The User FPGAs 117b-117f perform the operations of the DUT 114, and transmit data containing the outputted results of the DUT 114 to the Debug FPGA 117a. The Debug FPGA 117a evaluates the data (received from the User FPGAs 117b-117f) against user-defined trigger conditions that indicate a trigger event. If the Debug FPGA 117a identifies a trigger event, the Debug FPGA 117a sends a clock-stopping signal to clock circuits (not shown) of the User FPGAs 117b-117f to stop a synchronized clock shared by the User FPGAs 117b-117f, thereby halting execution of the DUT 114. In some implementations, each of the User FPGAs 117*b*-117*f* transmits output data to the Debug FPGA 117*a*. In some implementations, the Debug FPGA 117*a* transmits the clock-stopping signal to the clock circuit of the Master FPGA 117*b*, which in turn, sends the clock-stopping signal each of the clock circuits of the other User FPGAs 117*c*-117*f.*

The testbench software 124 tracks the status, and controls the performance, of components of the prototyping system 102. The testbench software 124 may determine which components of the prototyping system 102 are available or unavailable to receive parts of the IC design logic generated by the compiler 122. For instance, the configuration manager 124 determines the availability of the circuit boards 115 and FPGAs 117 and selects the allocated board 115*a* and allocated FPGAs 117*a*-117*f* for performing the user's DUT 114. In some cases, the testbench software 124 continuously polls or self-tests the prototyping system 102 for faulty hardware components. In some cases, the testbench software 124 may determine the status of components of the prototyping system 102 when the compiled IC design logic is loaded into the hardware components of the prototyping system 102.

Additionally or alternatively, in some implementations, a configuration manager 126 component of the testbench software 124 tracks the status of compiled instructions and controls the execution of instructions by components of the prototyping system 102. The configuration manager 126 may determine which components of the prototyping system 102 are available or unavailable to receive parts of the IC design logic generated by the compiler 122. For instance, the configuration manager 126 determines the availability of the circuit boards 115 and FPGAs 117 and selects the allocated board 115*a* and allocated FPGAs 117*a*-117*f* for performing the user's DUT 114. In some cases, the configuration manager 126 continuously polls or self-tests the prototyping system 102 for faulty hardware components, and may track the availability of various components of the prototyping system 102.

At compile-time or runtime of the DUT 114, the testbench software 124 selects the allocated FPGAs 117*a*-117*f* based upon availability and other efficiency metrics related to the speed that the available hardware components exchange or process signals, such as the relative distances between the available FPGAs 117. Similarly, the testbench software 124 selects and designates the Master FPGA 117*b* based upon the relative distances to the allocated FPGAs 117*a*-117*f* and other hardware resources of the prototyping system 102, among other potential metrics. In some cases, for example, the testbench software 124 selects and designates the Master FPGA 117*b* based upon relative delay for signals to reach each allocated FPGA 117*a*-117*f.*

The Master FPGA 117*b* receives and distributes various signals, from or to other components of the system 100. For instance, the Master FPGA 117*b* receives a trigger signal (as the clock-stopping signal) from the Debug FPGA 117*a* for stopping the common synchronized clock of the User FPGAs 117*b*-117*f.* The clock circuit (not shown) of the Master FPGA 117*b* receives the clock-stopping signal from the Debug FPGA 117*a*, via the user interface module of the Master FPGA 117*b*, and distributes the clock-stopping signal to the clock circuits (or other circuit devices) of the other User FPGAs 117*c*-117*f.*

In addition to generating and compiling the IC design, the testbench software 124 generates various types of testbench configuration files for configuring certain execution behaviors of the prototyping instrumentation 112, such as the Debug FPGA 117*a*. As an example, the testbench software 124 may generate configuration files for a component (e.g., trigger mask register) of the Debug FPGA 117*a* that indicates trigger conditions evaluated by a processor (e.g., trigger processor) of the Debug FPGA 117*a* references. As another example, the testbench software 124 may generate configuration files for a component of the Debug FPGA 117*a* that indicates the Master FPGA 117*b* (e.g., master mask register) for the Debug FPGA 117*a* to correctly send the trigger signals for clock-stopping. At compile-time or runtime, the testbench software 124 distributes the user's configuration files associated with the user's DUT 114 to the components of the prototyping system 102. In some cases, the testbench software 124 (or software program of the prototyping system 102) converts or compiles the configuration files into an appropriate format or representation for the destination component, such as registers referenced by the processor of the Debug FPGA 117*a*.

The configuration files include various types of information written in various languages or representations. The information may include, for example, indicators of the bits, buses, or pins to evaluate, or the indicators of the sources or destinations for the data inputs or outputs, among others. As an example, the data comprises 64 bits, and the User FPGAs 117*b*-117*f* and/or DUT 114 employ 64 buses, thereby outputting 64 signals. A configuration file may indicate to the Debug FPGA 117*a* (or other aspects of the prototyping system 102) certain bus addresses, signal addresses, indexes, or other information about the given signals. This information may form the basis for a Boolean test of a trigger condition or inform other behaviors of the prototyping system 102, such as directing the output of a signal to another component of the prototyping system 102. As another example, the information may include programming code in a high-level language, such as state definition (or description) language (SDL) or hardware description language (HDL), representing a series of operations or Boolean evaluations that indicate instances of state transitions of hardware resources of the prototyping system 102. In addition, the testbench software 124 generates or converts the configuration files in any data format compatible with the hardware components of the prototyping system 102. Non-limiting examples of the configuration files generated and distributed by the testbench software 124 include text files containing SDL or HDL programming, JSON files containing testbench configurations, and the like.

The various software components of the testbench software 124 may be executed in whole or in part on the host system 104, such as an administrator workstation computer or the designer's workstation computer. The host system 104 may execute the compiler 122 module that allows the user to input an IC design file, containing logic gate designs of the prototype IC design, and then compiles the IC design file to generate the DUT 114. The host system 104 may also execute the configuration manager 126 that tracks and allocates the availability of resources within the prototyping system 102. The configuration manager 126 transmits, or otherwise downloads, the resulting DUT 114 into the allocated hardware of the prototyping instrumentation 112.

Prototyping System

The prototyping system 102 comprises an I/O interface architecture 106, a synchronization subsystem 110, and prototyping instrumentation 112, which include logic-execution aspects of the prototyping system 102 comprising various hardware (e.g., IC boards 115, FPGAs 117) and software components of the prototyping system 102. It should be appreciated that such logic-execution aspects are mentioned for ease of description and understanding and are not necessarily boundaries or strictly defined sets of components.

The I/O interface architecture 106 comprises hardware components for managing communications among components of the system 100. This subsystem provides a number of functions including, for example, providing the PCI interface 136 (or other types of interfaces for the communication link 105), communicating runtime communication (e.g., design logic instructions download, configuration, runtime control), and exchanging various types of design data, among other potential functions.

The synchronization subsystem 110 is a logical collection of hardware and/or software components responsible for maintaining synchronization and controlling execution timing of components of the prototyping system 102. At runtime, the prototyping system 102 downloads the IC design data via the communication link 105, configures the synchronization clocking logic of the allocated prototyping instrumentation 112, and performs the functions of the DUT 114 according to the testbench instructions as instructed. The prototyping instrumentation 112 synchronously performs the functions of the DUT 114 according to clocking circuits on each circuit board 115 or FPGA 117.

The prototyping instrumentation 112 comprises hardware components (and, in some embodiments, software-based virtual components) for executing the design logic of the DUT 114, transferring design and/or control data between components, and managing the execution. The prototyping instrumentation 112 may test, verify, and debug the operation of the DUT 114, an entire board of ICs, or an entire system, without having to actually, physically fabricate the hardware. The prototyping instrumentation 112 generally comprises any number of racks with any number of IC boards 115, sometimes organized logically into any number of board clusters. Each IC board 115 comprises one or more processors or programmable logic devices (PLDs), such as the FPGAs 117 or ASICs. The FPGAs 117 (or other types of processors) mimic the logic gates (or other logic or devices) of the DUT 114, according to the machine-readable instructions compiled for the IC design.

In some embodiments, the prototyping system 102 may further comprise an instruction database (not shown) and a resource index database (not shown). The instruction database may store records of the IC design logic, instruction sets compiled by the compiler 122, testbench code (e.g., SDL-based conditions), and testbench configuration files (e.g., JSON files), among other types of data. The instruction database is hosted in non-transitory machine-readable storage medium of any computing device capable of hosting the instruction database and performing the various tasks and processes associated with the instruction database, as described herein. The instruction database may receive, from the compiler 122, instructions compiled for the IC design being tested (e.g., DUT 114) or the testbench configurations created by the designer. In some cases, the instructions may be contained within a logic file generated by the compiler 122. At download time, the hardware components of the prototyping system 102, such as registers of the FPGAs 201, 204, are loaded with the compiled instructions for the DUT 114.

Figure 2:
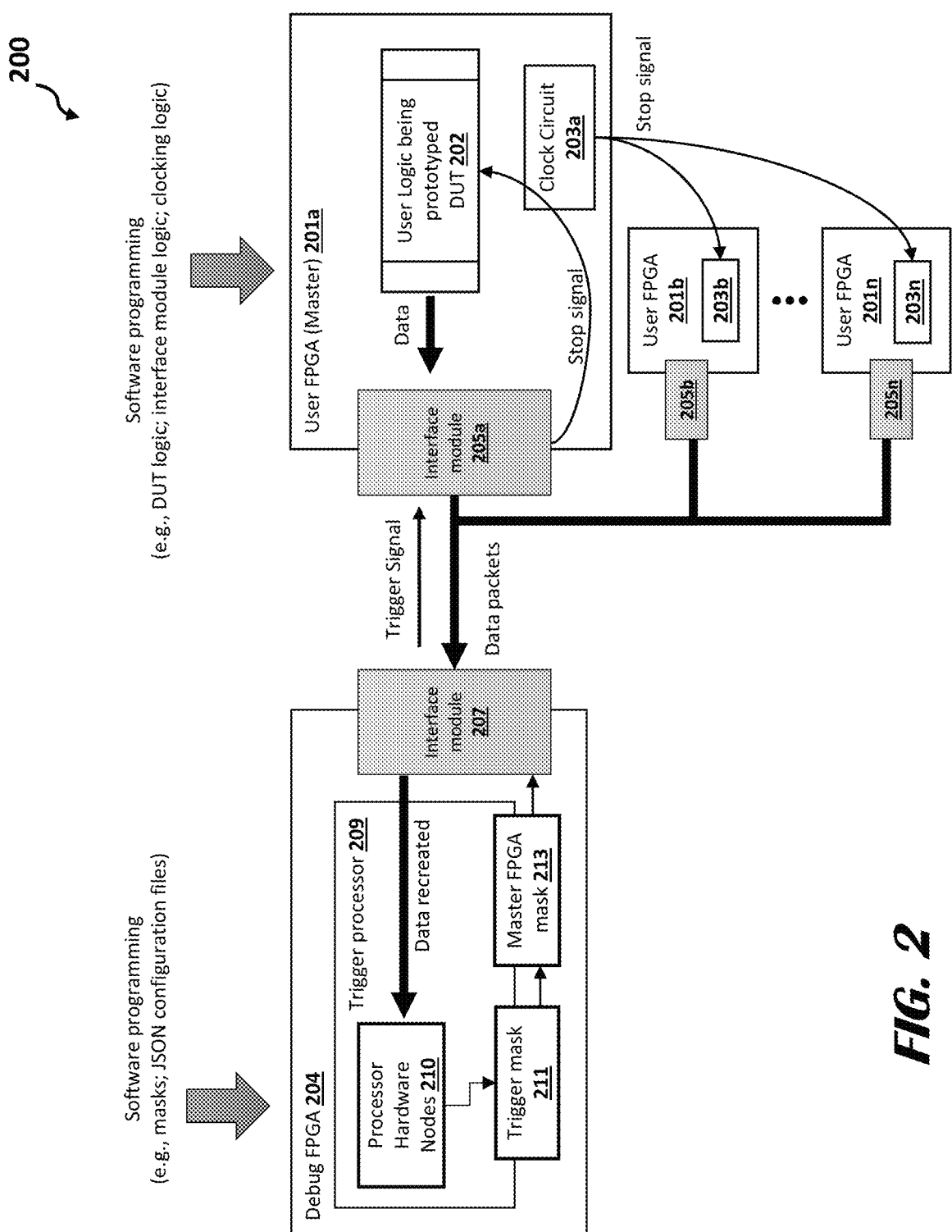
FIG. 2 shows a block diagram showing data flow among components of a system for prototyping an IC design, according to an embodiment.

FIG. 2 is a block diagram showing data flow among components of a system 200 for prototyping a DUT 202 of an IC design (e.g., prototyping system 104). The system 200 comprises any number of FPGAs 201, 204, including User FPGAs 201a-201n (collectively referred to as a "User FPGA 201" or "User FPGAs 201") and Debug FPGAs 203.

Embodiments may include additional or alternative components from than components shown in FIG. 2.

The system 200 includes any number of boards (e.g., circuit boards 105) comprising any number of FPGAs 201, 204. Testbench software of the system 200 allocates a set of User FPGAs 201 to execute machine-executable instructions parsed and compiled from an IC design by a compiler (or other testbench software) of the system 200. For ease of description, the testbench software allocates the set of User FPGAs 201 situated on the same IC board to execute the executable instructions of the DUT 202, though the management software could allocate the User FPGAs 201 across various different boards. Similarly, a board of the system 200 includes the Debug FPGA 204, situated on the same or different board as the User FPGAs 201.

The testbench software (or other software managing the prototyping operations of the system 200) designates a Master FPGA 201a selected from the User FPGAs 201 allocated to the user's DUT 202. The Master FPGA 201a receives and distributes various signals, from or to other components of the system 200. For instance, the Master FPGA 201a receives a trigger signal from the Debug FPGA 204 for stopping a common synchronized clock of the other User FPGAs 201b-201n. The clock circuit 203 of the Master FPGA 201a receives a clock-stopping signal via a user-side interface module 205a of the Master FPGA 201a, and the clock circuit 203 distributes the clock-stopping signal to the clock circuit 203 (or other circuit device) of the other User FPGAs 201b-201n.

The FPGAs 201, 204 communicate data via interface modules 205, 207, including user-side interface modules 205a-205n (collectively referred to as a "user-side interface module 205" or "user-side interface modules 205") associated with the User FPGAs 201 and a debug-side interface module 207 associated with the Debug FPGA 204. The interface modules 205, 207 communicate data between the User FPGAs 201 and the Debug FPGA 204 over one or more buses of the system 200 or IC boards. For instance, the user-side interface modules 205 generate one or more data packets representing a signal output generated by the User FPGAs 201 performing the DUT 202. Each user-side interface module 205 transmits the data packets, from the user-side interface modules 205, to the Debug FPGA 204. The debug-side interface module 207 receives and converts the data packets from the User FPGAs 201 to a signal pattern or other representation of recreated data corresponding to the signal outputs or other representation of data produced by the User FPGAs 201 for the DUT 202.

The User FPGA 201 performs a multiplexing operation for the data stream of bits output by the DUT 202, prior to transmitting the data packet(s) over the bus to the Debug FPGA 204. In some cases, the User FPGA 201 includes a multiplexer circuit (MUX) for multiplexing the bits of the output produced by the DUT 202, prior to feeding the bits to the user-side interface module 205. In some case, the user-side interface module 205 performs the multiplexing operations on the output of the DUT 202 prior to sending the data packet(s) to the Debug FPGA 204.

In many cases, the IC design or other configuration files created by the user do not include the interface modules 205, 207, as the interface modules 205, 207 are components for improving performance of the system 200 during prototyping operations and potentially unnecessary or superfluous to the intended IC design. In such cases, when parsing, compiling, or scheduling the instruction sets for the DUT 202, the testbench software generates and injects executable instructions as virtual logic representing the interface modules 205, 207, even if the designer's IC design does not include the interface modules 205, 207.

In some implementations, the testbench software includes software routines that generate the interface modules 205, 207, developed at compile-time according to a design representation language or tool (e.g., System Verilog-language code of the user's IC design) that automatically supplements the user's IC design to include the designs for the interface modules 205, 207 for managing the bitstreams of the FPGAs 201, 204. In operation, at compile-time, each instance when the user compiles the IC design, the testbench software automatically generates and integrates the design of the interface modules 205, 207 into the compiled DUT 202 of the user's IC design. The testbench software integrates the compiled interface modules 205, 207 into the compiled DUT 202 of the IC design.

In many circumstances, the FPGAs 201, 204 typically have limited connectivity between the FPGAs 201, 204. The boards having the FPGAs 201, 204 further include traces comprising wires of the board that interconnect the FPGAs 201, 204 and often have limited throughput. The boards employ time-division multiplexing for routing the data and may include various multiplexers (MUXs), which may further limit the throughput of the data on the wires or buses of the system 200. To improve data throughput, the system 200 includes the interface modules 205, 207, such as the user-side interface modules 205 that generates packets of the data (data packets) and sends the data packets to the Debug FPGA 204 over time, in batches. On the other side, the debug-side interface module 207 recreates or reassembles the data from the data packet(s) received from the User FPGAs 201.

In some implementations, the Debug FPGA 204 need not track the time or a clock. In such implementations, the user-side interface module 205 sends additional information along with the data packets to the debug-side interface module 207. For instance, the user-side interface module 205 sends a signal representing a ("data valid" signal) for running the clock in the User FPGA 201. The user-side interface module 205 of the User FPGA 201 sends the data valid signal to the Debug FPGA 204, causing the hardware device logic of the Debug FPGA 204 to create or implement a clock derived from the data valid signal. In this way, the Debug FPGA 204 tracks the time or clock, synchronized with or relative to how the User FPGA 201 is running.

The clock circuits 203 of the User FPGAs 201 maintain execution synchronization amongst the particular User FPGAs 201. The User FPGAs 201 include one or more clock circuits 203 that receive, distribute, and govern a common clock signal from a board-level or system-level clock, to maintain synchronization across the User FPGAs 201 allocated to the user's DUT 202.

In operation, the clock circuit 203 receives a clock-stop signal from the Debug FPGA 204 and the clock circuit 203 stops the common clock signal across the User FPGAs 201, halting the User FPGAs 201 from advancing to a next step or clock cycle of execution. In some cases, the clock circuit 203 of the Master FPGA 201a receives, distributes, and governs the common clock signal for each of the User FPGAs 201 allocated to the DUT 202.

The Debug FPGA 204 receives execution instructions for evaluating signal patterns in data or signals outputted by the User FPGAs 201 prototyping the DUT 202 by executing the executable instructions compiled for the IC design. The Debug FPGA 204 includes hardware components for evaluating the signal pattern data to determine whether the outputs for a given execution step of the DUT 202. The hardware components of the Debug FPGA 204 include, for example, a trigger processor 209, a trigger mask 211, and a master mask 213, where the hardware components include various types of hardware circuit devices or logic (e.g., gates, flip-flops, registers).

The trigger processor 209 includes circuit devices for performing Boolean evaluations using the data in the signal patterns. The trigger processor 209 includes hardware nodes comparing logic devices for performing portions of the Boolean evaluations for each state or clock cycle of the DUT 202. The trigger mask 211 indicates which Boolean evaluation is the triggering condition for the trigger event, such that the trigger mask 211 indicates which of the hardware nodes constitutes a "deciding node" performing the triggering Boolean evaluation for the given state or clock cycle. The trigger processor 209 identifies an instance of a trigger event according to a trigger condition indicated by the trigger mask 211.

The trigger mask 211 comprises hardware device logic and/or data storage (e.g., register, flip-flop) that indicates which bit or bits (in the data) represent a trigger event matched to a trigger condition (i.e., Boolean expression for a given hardware node of the trigger processor 209), as defined by the designer and downloaded to a register of the trigger mask 211. Using the testbench software, the designer inputs various trigger configuration preferences defining the circumstances in which the designer intends to stop the DUT 202, such as an execution breakpoint or debugging opportunity. The trigger mask 211 is loaded from configuration files (e.g., JSON files) generated by the testbench software according to the designer's trigger configuration preferences. The trigger mask 211 indicates and/or determines whether the data from the User FPGAs 201 represents an ordinary state transition during DUT 202 execution or a final trigger event for stopping the DUT 202 execution at the User FPGAs 201. In some cases, the testbench software designates a new trigger mask 211 for each state transition or clock cycle of the DUT 202, when the testbench software parses and loads the next testbench configuration into the registers of the Debug FPGA 204.

The master FPGA mask 213 (or master mask 213) comprises hardware device logic and/or data storage (e.g., register, flip-flop) that indicates the Master FPGA 201a of the set of one or more which User FPGAs 201, where the master mask 213 indicates the destination for the trigger signal, such as an address, index, alias shadow name, or other identifier of the Master FPGA 201a for directing the trigger signal. In some cases, the testbench software designates a different FPGA 201, 204 of the system 200 as the Master FPGA 201a each instance that the testbench software compiles the same or different IC design. In such cases, (the value of) the master mask 213 updates each new compilation of the same or different IC design.

In operation, the trigger processor 209 evaluates Boolean functions based on the data signals received from the User FPGAs 201. The trigger processor 209 then sends that data to the trigger mask 211. The trigger mask 211 determines whether the Boolean function's result (generated by the trigger processor 209) represents a state transition of executing (and stepping through) the DUT 202 operations, whether the Boolean function's result represents an actual final trigger condition, and whether to stop execution of DUT 202. The master mask 213 outputs a trigger signal to the master mask 213, which, in turn, sends the trigger signal to the Master FPGA 201a. In some configurations, each User FPGA 201 transmits data packets to the Debug FPGA 204, but the Debug FPGA 204 transmits the trigger signal to the Master FPGA 201*a*.

The testbench software includes software libraries that determine which testbench configurations should be imported from the configuration file (e.g., JSON file) for execution by the trigger processor 209. The inputs from the configuration file that indicate certain test values to be applied against input data from the User FPGA 201.

The master user-side interface module 205*a* receives and forwards the trigger signal or clock-stopping signal to the master clock circuit 203*a* of the Master FPGA 201*a*. The master clock circuit 203*a* distributes the clock-stopping signal to the other clock circuits 203*b*-203*n* of the other User FPGAs 201*b*-201*n*.

As an example, the User FPGAs 201 generate the data resulting from prototyping the DUT 202 and each of the User FPGAs 201 transmit the data packets to the Debug FPGA 204. When the Debug FPGA 204 generates a trigger signal, the Debug FPGA 204 transmits the trigger signal to the Master FPGA 201*a*. The clock circuits 203 of the User FPGAs 201 comprise hardware circuit logic that maintains the User FPGA 201 synchronization with the common clock, which may include logic for starting or stopping the clock (and execution) of the particular User FPGA 201. The master clock circuit 203*a* of the Master FPGA 201*a* includes hardware logic for stopping the clock (and execution) of the other User FPGAs 201*b*-201*n*.

Figure 3:
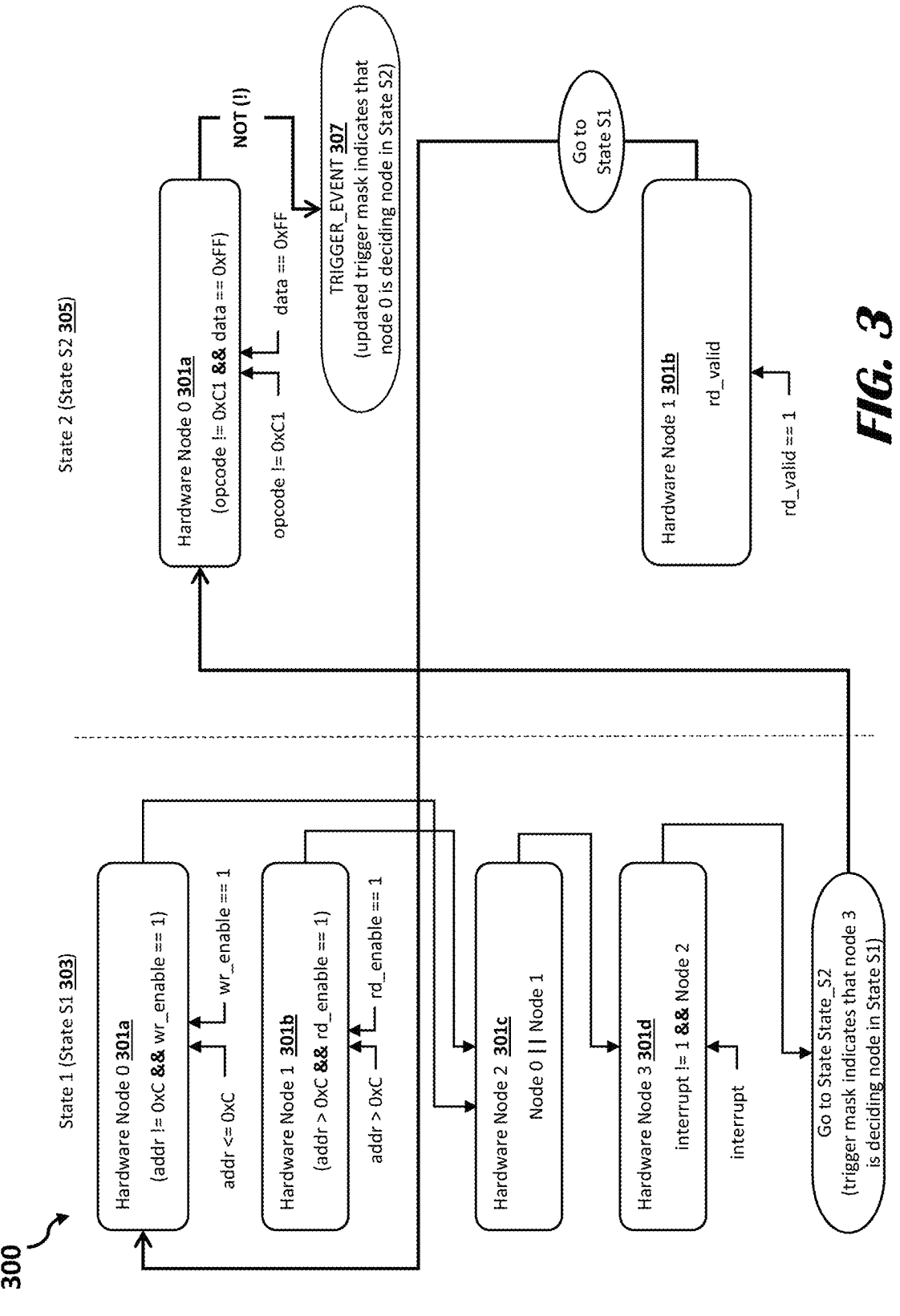
FIG. 3 shows components and data flow of a Debug FPGA during operations for prototyping a DUT compiled from an IC design, according to an embodiment.

FIG. 3 shows components and data flow of a Debug FPGA 300 during operations for prototyping a DUT, as compiled from an IC design. The Debug FPGA 300 includes a trigger processor having four hardware nodes 301*a*-301*d*, each comprising one or more logic circuit devices. The data flow depicts states 303, 305 of the IC design; the data flow also depicts instances that the IC design transitions from one state (State S1 303) to another state (State S2 305), and from State S2 305 to a Trigger Event 307, in accordance with configuration inputs of testbench code (e.g., SDL code entered by the designer using testbench software). Non-limiting examples of the types or formats of configuration data of the testbench code, as generated and distributed by the testbench software, including files containing SDL code, HDL code, JSON code, and the like.

As an example, the data comprises 64 bits, and the User FPGAs and/or DUT 114 employ 64 buses, thereby output-ting 64 signals. The configuration data of the testbench code may indicate to the Debug FPGA 300 (or other aspects of the prototyping system) certain bus addresses, signal addresses, indexes, or other information about the given signals. This information may form the basis for a Boolean test of a trigger condition or inform other behaviors of the prototyp-ing system, such as directing the output of a signal to another component of the prototyping system. In this example, a simplified instance of the configuration file (e.g., JSON file) of the testbench code may include:

Bit[0]: "signal address_bus", index: 0, shadow_name: "sig0"

Bit[1]: "signal address_bus", index: 0, shadow_name: "sig0"

Bit[2]: "signal address_bus", index: 0, shadow_name: "sig0"

Bit[63]: "signal address_rst", index: 0, shadow_name: "sig0"

As another example, the configuration information includes programming code in a high-level language, such as state definition language (SDL), representing a sequence of operations (e.g., Boolean evaluations) that indicate instances of state transitions (e.g., from State S1 303 to State S2 305) of hardware resources of the prototyping system or trigger conditions for trigger events. In this example, a simplified instance of the state-transition or trigger-detection testbench code in the configurations of the testbench may include:

```
State S1 {
if (interrupt !=1 && ((addr<=0xC && wr_enable==1)||
  (addr>0xC && rd_enable==1))){goto S2; }}
State S2 {
if (!(opcode !=0xC1 && data==0xFF)){
trigger;}
if (rd_valid) {
goto S1; }}
```

At runtime (or, in some embodiments, at compile-time), the Debug FPGA 300 receives and loads a sequence of operations (e.g., Boolean expressions) performed by the hardware nodes 301 of the trigger processor. Within a given clock cycle of the DUT, the trigger processor transitions through multiple states 303, 305. Accordingly, the hardware nodes 301 of the trigger processor perform the functions of a particular state 303, 305 within a fraction of the given clock cycle. To quickly perform the functions of multiple states 303, 305, certain hardware nodes 301 may perform the functions of a particular state 303, 305 in parallel (e.g., simultaneously, contemporaneously, independently). For example, a first hardware node 301*a* and a second hardware node 301*b*, in parallel, load and execute respective function instructions (from the testbench instructions) using data inputs (from the User FPGA or the testbench instructions). In this example, a third hardware node 301*c* and fourth hardware node 301*d* may load the respective function instructions parallel to the first hardware node 301*a* and second hardware node 301*b*. However, the third hardware node 301*c* awaits and uses, as inputs, the outputs of the first hardware node 301*a* and the second hardware node 301*b*, according to the function loaded from the testbench instruc-tions. Similarly, the fourth hardware node 301*d* awaits and uses the output of the third hardware node 301*c* as well as an additional input from the testbench instructions or the data inputs (from the User FPGA).

The IC design starts at State S1 303 and transitions to State S2 305, and then ultimately, detects a Trigger Event 307. The instructions of the testbench code include Boolean expressions (or trigger masks) that test for the state transi-tions or the Trigger Event 307. As shown in the example of FIG. 3, in State S1 303, fourth hardware node 301*d* performs the Boolean expression for detecting a state transition. When the fourth hardware node 301*d* determines the data outputs meet the condition required by the Boolean expression for State S1 303, then the Debug FPGA 300 determines the state-transition is satisfied, though not a trigger condition for the Trigger Event 307. In State S2 305, the function per-formed by the first hardware node 301*a* includes the Bool-ean expression for detecting the Trigger Event 307. In State S1 303, the trigger processor (at the fourth hardware node 301*d*) merely detected a state transition and not a Trigger Event 307, so the Debug FPGA 300 does not yet send a clock-stopping trigger signal to stop the clock of the User FPGAs.

When the Debug FPGA 300 transitions to State S2 305, the testbench software (e.g., testbench software 124 shown in FIG. 1) executes software routines that load updated testbench functions and data into the registers of the trigger processor, thereby changing the programming of the hard-ware nodes 301. In some implementations, the testbench software (or other component of the prototyping system)

wipes the registers of the hardware nodes 301. The testbench software then instructs the Debug FPGA 300 to continue evaluating whether the data satisfies the trigger condition for the Trigger Event 307. For instance, in State S2 305, the first hardware node 301*a* performs a Boolean function for detecting the Trigger Event 307 by determining whether the data inputs (from the testbench instructions or from the User FPGAs) satisfy the condition expressed by the Boolean function. In State S2 305, the trigger processor (at the first hardware node 301*a*) may detect the Trigger Event 307, so the Debug FPGA 300 sends the clock-stopping trigger signal to stop the clock of the User FPGAs. If, however, the trigger processor does not detect the trigger condition for the Trigger Event 307, then, in parallel, the second hardware node 301*b* of the Debug FPGA 300 performed another Boolean expression for detecting another state transition. In the example of FIG. 3, the function performed by the second hardware node 301*b* takes an input that always resolves as detecting a state-transition condition, and thus always transitions back to State S1 303.

In this way, the Debug FPGA 300 performs a sequence of functions for detecting a Trigger Event 307 representing circumstances that the designer wants to stop the User FPGAs. The Debug FPGA 300 (or other device of the prototyping system) may include any new or known trigger pulsing device (not shown) for sending a triggered pulse of the clock-stopping signal from the Debug FPGA 300 to the User FPGA, though the Debug FPGA 300 implements the sequence of functions for detecting the Trigger Event 307 that stops each of the clocks of the User FPGAs not found in prior approaches to design verification or validation (e.g., FPGA-based prototyping). In this way, as an improvement on conventional approaches, embodiments of the Debug FPGA 300 may scan (or otherwise evaluate) data from any number of FPGAs in parallel. Additionally or alternatively, as another potential improvement on conventional approaches, embodiments of the Debug FPGA 300 may sends a trigger appropriately to the master User FPGA without affecting the other User FPGAs, which may be used by, or in use by, other users of the prototyping system.

FIG. 4 shows operations of a method 400 for handling trigger conditions during operations for FPGA-based prototyping a DUT for an IC design.

In operation 401, a designer-user operates design software (e.g., testbench software 124) executed by a host computing device to create an IC design and testbench configurations for prototyping the DUT of the IC design. The design software generates testbench code or testbench configuration files according to user inputs, and compiles the testbench code or testench configuration files into the testbench functions (e.g., sequence of trigger conditions, mask test values for mask registers). The design software generates a design file defining the IC design according to a machine-readable language created by the user inputs, and compiles the IC design into the executable instructions of the DUT.

The user interacts and operates a graphical user interface of the design software to create, design, or import one or more representations of an IC design, which includes a high-level software program language and/or graphical-visual representation of the IC design. Non-limiting examples of potential data types or representations of the IC design, DUT, testbench, or configuration files include JSON files, netlists, SDL files, Verilog code, System Verilog Transaction Level Models, VHDL code, a C/C++ model, SystemC code, and Simulink code, among other potential languages, tools, or representations. A compiler program of the design software compiles the IC design into machine-readable and device-executable instructions for execution or storage by prototyping instrumentation devices (e.g., FPGAs, ASICs, MUXs, memories, registers) of a prototyping system. The compiled instructions of the IC design are loaded as a DUT into the hardware and software components of the prototyping instrumentation, allowing the prototyping instrumentation to test the IC design by executing functions of the DUT as compiled from the IC design.

The user further operates the design software to write or otherwise generate testbench code containing code or logic defining configurations, triggers, breakpoints, or other operations intended to test or analyze certain aspects of the IC design by managing the execution of the DUT. The generates certain testbench code or configuration files using, for example, SDL code for defining state transitions or trigger conditions, among other types of configurations.

In some implementations, the design software automatically generates logic for certain types of prototyping instrumentation hardware (e.g., interface modules) not otherwise coded by the designer. In this way, at compile-time, the design software may automatically inject the hardware logic into the DUT and/or testbench for execution by the corresponding prototyping instrumentation or testbench instrumentation.

In operation 403, at compile-time, the design software compiles and deploys the testbench code as the designer's testbench for the DUT. The design software further compiles and deploys certain design configurations for performing the DUT from a configuration file (e.g., JSON file). For instance, the design software generates one or more configuration files representing certain aspects of the IC design or DUT configurations or configurations for prototyping the DUT. The design software compiles the instructions or testbench for the debug FPGA and the instructions or configurations for the user FPGAs.

In operation 405, at runtime for a given clock cycle of the DUT's prototyping instrumentation (or, in some cases, at compile-time), the design software parses the compiled DUT and/or testbench, for distributing and loading the DUT and testbench instructions to certain portions of the prototyping hardware instrumentation (e.g., User FPGAs, Debug FPGA), thereby programming the prototyping instrumentation to perform the DUT and testbench operations.

The design software generates executable instructions for programming the registers of the Debug FPGA and/or registers of the User FPGA. The design software generates and parses a trigger mask of the testbench configuration instructions for a given clock cycle, and loads the trigger mask into a mask register to stop the design only on the detecting the trigger condition marked by the designer as the trigger in the configuration instructions for controlling execution of the DUT. In some cases, the design software generates and parses a master mask that indicates a Master FPGA of the User FPGAs. When the Debug FPGA detects a trigger event according to the trigger mask, the Debug FPGA sends a trigger signal to stop the clock of the User FPGAs. The FPGA sends the trigger signal to the Master FPGA, which in turn, forwards the trigger signal to the other User FPGAs. In this way, the trigger signal is bounded according to the master mask loaded in the mask register, which protects other FPGAs allocated for another designer.

In operation 407, the User FPGAs perform the operations of the DUT to generate data outputs for the particular clock cycle. For instance, the hardware devices of the User FPGAs perform the functions of the DUT, and monitor the DUT logic for data outputs at each clock cycle. The User FPGA captures and forwards the data outputs to the Debug FPGA.

In operation 409, user-side interface modules of the User FPGAs ("user interface modules") convert the data outputs into data packets. Each user interface module of the User FPGAs sends the data packets to the Debug FPGA via one or more buses interconnecting the Debug FPGA to the User FPGAs.

In some cases, the user interface modules are a special type of hardware block logic for the DUT, which the design software generates and injects or embeds into the DUT logic for each of the User FPGAs. Each user interface module collects the outputted data (as indicated by designer's testbench configurations) of the particular User FPGA, processes the data outputs into data packets, and sends the data packets to the Debug FPGA. At each clock cycle, the User FPGAs generate the data outputs and send the data packets to Debug FPGA.

In operation 411, the Debug FPGA receives signal patterns representing the data outputs generated by the User FPGAs. Using the signal pattern received from the User FPGAs for the particular clock cycle, the Debug FPGA processes a series of Boolean expressions (defined by the testbench and design configurations). During operation, the Debug FPGA references the signal patterns as certain signal comparators for the Boolean expressions. In certain circumstances, the Debug FPGA returns a trigger signal to the User FPGAs, which the User FPGAs or the Master FPGA receives as the clock-stopping signal.

A debug-side interface module of the Debug FPGA ("debug interface module") receives and converts the data packets into the signal patterns representing the data outputted by the User FPGAs. The debug interface module sends the data to a trigger processor of the Debug FPGA via traces or wires interconnecting the components of the Debug FPGA. Likewise, the trigger processor generates and sends a trigger signal to the debug interface module, which in turn, transmits the trigger signal to the User FPGA or the Master FPGA.

In some cases, the debug interface module is a special type of hardware block logic for the testbench, which the design software generates and injects or embeds into the testbench logic for the Debug FPGA. The debug interface module collects the data packets received from the User FPGAs, processes the data packets into the signal patterns representing the data packets, and sends the data to the trigger processor. At each clock cycle, the Debug FPGA evaluates signal patterns received from the User FPGAs for the particular clock cycle.

In operation 413, the Debug FPGA determines whether the signal pattern satisfies a trigger condition for a trigger event indicated by the testbench, rather than, for example, a state transition. Using the data outputs received from the User FPGAs and the testbench instructions, hardware nodes of the trigger processor perform Boolean functions for detecting state transitions or detecting trigger events. The hardware nodes continue to perform the sequence of Boolean functions for detecting a state transition of the DUT. Eventually, however, the Boolean functions indicate a trigger condition of the DUT that satisfies the trigger event, such that the sequence of Boolean functions detect the particular trigger event required for stopping the clock cycles of the User FPGAs performing the DUT.

If the Debug FPGA does not identify a trigger event after applying the sequence of Boolean functions on the data outputs of the User FPGAs, then the prototyping system returns to earlier operation 405, in which the prototyping system parses and applies a next selection of testbench configurations for the hardware components (e.g., Debug FPGA), which the prototyping system applies for the next clock cycle of the DUT. The prototyping system wipes the registers of hardware nodes of the Debug FPGA, and then selects and parses the next testbench code for the next clock cycle. The prototyping system then loads the next testbench code into the Debug FPGA hardware for the next clock cycle.

However, in operation 415, if the Debug FPGA detects the trigger event (in step 413), the Debug FPGA sends a trigger signal (sometimes referred to as a clock-stopping signal) for the clock circuits of the User FPGAs. The trigger signal causes the clock circuits of the User FPGAs to synchronously stop the clocks of the User FPGAs.

In optional operation 417, the testbench software outputs to a graphical user interface or computer file accessible to the designer listing the sequence of inputs, outputs, and other types of information related to the DUT functions and testbench configurations that produced trigger signal. The designer reviews this information to analyze and/or debug the functions of the DUT and the IC design.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, attributes, or memory contents. Information, arguments, attributes, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A system for prototyping designs-under-test (DUTs) of integrated circuit (IC) designs using programmable field-programmable gate arrays (FPGAs), the system comprising:
    a debug FPGA configured to:
        receive a signal pattern of data received from one or more user FPGAs performing a DUT;
        identify a state transition of the DUT based upon the signal pattern from the one or more user FPGAs performing the DUT;
        identify a trigger event based upon comparing the signal pattern against a trigger condition stored into a trigger mask register of the debug FPGA that is updated for each clock cycle, wherein the trigger condition is based on machine-executable testbench instructions of a configuration file; and
        transmit a trigger signal to the one or more user FPGAs for stopping a clock of the one or more user FPGAs in response to identifying the trigger event.

2. The system according to claim 1, wherein the debug FPGA is further configured to:
    identify a master FPGA of the one or more user FPGAs based upon a destination indicator of a master mask register,
    wherein the debug FPGA transmits the trigger signal to the master FPGA of the one or more user FPGAs.

3. The system according to claim 1, further comprising:
    a debug interface module coupled to the debug FPGA, configured to:
        receive one or more data packets containing a data output from the one or more user FPGAs; and convert the one or more data packets into the signal pattern.

4. The system according to claim 1, wherein the debug FPGA receives a plurality of signal patterns containing a plurality of corresponding data from the one or more user FPGAs, and
    wherein the debug FPGA receives each signal pattern at a corresponding clock cycle of the DUT performed by the one or more user FPGAs.

5. The system according to claim 1, wherein the debug FPGA includes one or more logic devices organized as one or more hardware nodes, each hardware node configured to perform a Boolean operation according to testbench instructions compiled from testbench code for identifying the trigger event.

6. The system according to claim 5, wherein the debug FPGA is further configured to receive one or more Boolean operations for the corresponding one or more hardware nodes, the one or more Boolean operations comprising machine-executable instructions parsed from one or more configuration files for a clock cycle of the clock.

7. The system according to claim 5, wherein one or more bits of the trigger mask register indicate a deciding hardware node of the one or more hardware nodes, and wherein the Boolean operation of the deciding hardware node represents the trigger condition indicating the trigger event.

8. The system according to claim 1, wherein the debug FPGA is further configured to:
    for a first clock cycle of the clock,
        receive a set of one or more bits of a first trigger mask according to the machine-executable testbench instructions of the configuration file; and
        store the first trigger mask into the trigger mask register; and
    for a next clock cycle of the clock,
        receive an updated set of one or more bits of a second trigger mask according to the machine-executable testbench instructions of the configuration file; and
        store the second trigger mask into the trigger mask register.

9. The system according to claim 1, wherein the debug FPGA comprises an interface module configured to:
    receive one or more data packets from a user FPGA; and
    generate the signal pattern for the debug FPGA converted from the one or more data packets.

10. A system for prototyping designs-under-test (DUTs) of integrated circuit (IC) designs using programmable field-programmable gate arrays (FPGAs), the system comprising:
    a plurality of user FPGAs, including a set of one or more user FPGAs configured to:
        receive an instruction set for performing a DUT for an IC design file; and
        generate a data output based upon the instruction set for a clock cycle of a clock associated with the set of one or more user FPGAs; and
    a debug FPGA configured to:
        identify a trigger event based upon comparing a signal pattern for each data output from the set of one or more user FPGAs against a trigger condition stored into a trigger mask register of the debug FPGA that is updated for each clock cycle, wherein the trigger condition is based on machine-executable testbench instructions of a configuration file;
        identify a master FPGA of the set of one or more user FPGAs based upon a destination indicator of a master mask register; and

21 transmit a trigger signal to the master FPGA of the set of one or more user FPGAs for stopping the clock at the master FPGA for the set of one or more user FPGAs.

11. The system according to claim 10, each debug FPGA further configured to identify a state transition of the DUT based upon the signal pattern from the set of one or more user FPGAs performing the DUT.

12. The system according to claim 10, wherein each user FPGA comprises a clock circuit configured to receive the trigger signal for stopping the clock of a respective user FPGA, and wherein the clock circuit of the Master FPGA is further configured to send the trigger signal to each of the clock circuits of the set of one or more user FPGAs.

13. The system according to claim 10, wherein each user FPGA includes a user interface module for a respective user FPGA, the user interface module configured to:

generate one or more data packets containing the data output generated by the respective user FPGA at the clock cycle; and transmit the one or more data packets containing the data output to the debug FPGA.

14. The system according to claim 10, further comprising a debug interface module coupled to the debug FPGA, the debug interface module configured to:

receive one or more data packets containing the data output from the set of one or more user FPGAs; and convert the one or more data packets into the signal pattern for the data output from the set of one or more user FPGAs.

15. A system for prototyping designs-under-test (DUTs) of integrated circuit (IC) designs using programmable field-programmable gate arrays (FPGAs), the system comprising:

a processor configured to:

compile a plurality of instruction sets for a DUT from an IC design file and a plurality of testbench instructions according to one or more configuration files; and for a first clock cycle of the DUT, parse the plurality of testbench instructions for a plurality of registers of a debug FPGA; and the debug FPGA configured to, for the first clock cycle of the DUT:

update the plurality of registers according to the plurality of testbench instructions parsed for the first clock cycle, including a trigger mask register;

identify a trigger event based upon comparing a signal pattern for data outputs from one or more user FPGAs against a trigger condition indicated by the trigger mask register, wherein the trigger condition is based on the plurality of testbench instructions of the one or more configuration files; and

transmit a trigger signal to the one or more user FPGAs for stopping a clock of the one or more user FPGAs in response to identifying the trigger event.

16. The system according to claim 15, wherein the debug FPGA is further configured to:

update a master FPGA register of the plurality of registers according to a destination indicator of the plurality of testbench instructions parsed for the first clock cycle; and identify the master FPGA of the one or more user FPGAs based upon the destination indicator of a master mask register, wherein the debug FPGA transmits the trigger signal to the master FPGA of the one or more user FPGAs.

17. The system according to claim 15, wherein the debug FPGA includes one or more logic devices organized as one or more hardware nodes, and wherein each hardware node is configured to perform a Boolean operation according to the plurality of testbench instructions for the first clock cycle.

18. The system according to claim 17, wherein one or more bits of the trigger mask register indicate a deciding hardware node of the one or more hardware nodes for the first clock cycle, and wherein the Boolean operation of the deciding hardware node represents the trigger condition indicating the trigger event for the first clock cycle.

19. The system according to claim 15, wherein the processor is further configured to, for a second clock cycle of the DUT, parse the plurality of testbench instructions to generate updated testbench instructions for the plurality of registers of the debug FPGA; and wherein the debug FPGA is further configured to, for the second clock cycle of the DUT:

update the trigger mask register of the plurality of registers according to the updated testbench instructions; and identify a second trigger event based upon comparing an updated signal pattern for updated data outputs from the one or more user FPGAs against an updated trigger condition indicated by the trigger mask register.

20. The system according to claim 19, wherein the debug FPGA is further configured to, for the second clock cycle:

update a master mask register of the plurality of registers according to an updated destination indicator of the updated testbench instructions; and identify an updated master FPGA of the one or more user FPGAs based upon the updated destination indicator of the master mask register, wherein the debug FPGA transmits the trigger signal to the updated master FPGA of the one or more user FPGAs according to the updated destination indicator.

* * * * *